United States Patent
Phadke et al.

(10) Patent No.: US 12,431,281 B2
(45) Date of Patent: Sep. 30, 2025

(54) QUASI-PLANAR TRANSFORMER CONSTRUCTION

(71) Applicant: Apple Inc., Cupertino, CA (US)

(72) Inventors: Vijay G Phadke, San Jose, CA (US); Prudhvi Mohan Maddineni, Santa Clara, CA (US); Balal Khan, Guilford, CT (US)

(73) Assignee: Apple Inc., Cupertino, CA (US)

( * ) Notice: Subject to any disclaimer, the term of this patent is extended or adjusted under 35 U.S.C. 154(b) by 757 days.

(21) Appl. No.: 17/663,538

(22) Filed: May 16, 2022

(65) Prior Publication Data
US 2023/0368963 A1    Nov. 16, 2023

(51) Int. Cl.
H01F 27/28    (2006.01)
H01F 27/24    (2006.01)
H05K 1/11     (2006.01)
H05K 1/18     (2006.01)

(52) U.S. Cl.
CPC ........ *H01F 27/2823* (2013.01); *H01F 27/24* (2013.01); *H01F 27/2804* (2013.01); *H05K 1/115* (2013.01); *H05K 1/18* (2013.01); *H05K 2201/1003* (2013.01)

(58) Field of Classification Search
CPC .. H01F 27/2823; H01F 27/24; H01F 27/2804; H05K 1/115; H05K 1/18; H05K 2201/1003
See application file for complete search history.

(56) References Cited

U.S. PATENT DOCUMENTS

| | | | |
|---|---|---|---|
| 6,522,233 B1* | 2/2003 | Kyoso ................... | H01F 27/324 336/200 |
| 6,980,077 B1 | 12/2005 | Chandrasekaran et al. | |
| 7,439,838 B2* | 10/2008 | Chen ................... | H01F 27/2866 336/198 |

(Continued)

FOREIGN PATENT DOCUMENTS

| CN | 203134536 U | | 8/2013 |
|---|---|---|---|
| CN | 207353061 U | * | 5/2018 |

(Continued)

OTHER PUBLICATIONS

U.S. Appl. No. 17/663,547, filed May 12, 2022, Vijay G. Phadke.

(Continued)

*Primary Examiner* — Malcolm Barnes
(74) *Attorney, Agent, or Firm* — FLETCHER YODER PC

(57) ABSTRACT

A quasi-planar transformer can include a first winding comprising one or more turns of wire, a second winding comprising one or more turns of a conductive trace disposed on a printed circuit board, and a magnetic core positioned with respect to the first and second windings so as to provide a magnetic flux path coupling the first and second windings. The first winding can be a primary winding having a first half wound in a clockwise direction on a first side of the printed circuit board and a second half wound in a counter-clockwise direction on a second side of the printed circuit board, wherein the first and second halves are formed of a single continuous wire. The single continuous wire can pass through an opening in the printed circuit board. The first and second halves of the primary winding can be secured to the printed circuit board.

16 Claims, 8 Drawing Sheets

(56) References Cited

U.S. PATENT DOCUMENTS

| | | | |
|---|---|---|---|
| 8,164,406 B2* | 4/2012 | Lin | H01F 27/2866 336/232 |
| 8,212,644 B2 | 7/2012 | Young et al. | |
| 8,395,470 B2* | 3/2013 | Lin | H01F 27/2866 336/197 |
| 2002/0159214 A1* | 10/2002 | Perlick | H01F 27/29 361/160 |
| 2006/0038649 A1* | 2/2006 | Mehrotra | H01F 27/2804 336/83 |
| 2011/0018676 A1* | 1/2011 | Young | H01F 27/2871 336/200 |
| 2013/0207767 A1* | 8/2013 | Worthington | H01F 27/363 336/84 C |
| 2014/0327509 A1 | 11/2014 | Lacerda | |
| 2015/0061805 A1* | 3/2015 | Eom | H01F 27/2847 336/200 |
| 2022/0093320 A1 | 3/2022 | Zha et al. | |

FOREIGN PATENT DOCUMENTS

| | | | | |
|---|---|---|---|---|
| CN | 108492967 | A | 9/2018 | |
| CN | 108717902 | A | 10/2018 | |
| CN | 208570344 | U | 3/2019 | |
| CN | 109698058 | A | 4/2019 | |
| CN | 110233028 | A | 9/2019 | |
| CN | 209962853 | U | 1/2020 | |
| CN | 210805499 | U | 6/2020 | |
| CN | 112687458 | A | 4/2021 | |
| CN | 112700956 | A * | 4/2021 | H01F 27/2804 |
| CN | 113327751 | A | 8/2021 | |
| KR | 101943498 | B1 | 1/2019 | |
| KR | 101943499 | B1 | 1/2019 | |
| KR | 20200141018 | A | 12/2020 | |
| KR | 102250207 | B1 * | 5/2021 | |

OTHER PUBLICATIONS

U.S. Appl. No. 17/663,543, filed May 12, 2022, Balan Khan.
International Search Report & Written Opinion for PCT Application No. PCT/US2023/021058 dated Aug. 14, 2023; 27 pgs.

* cited by examiner

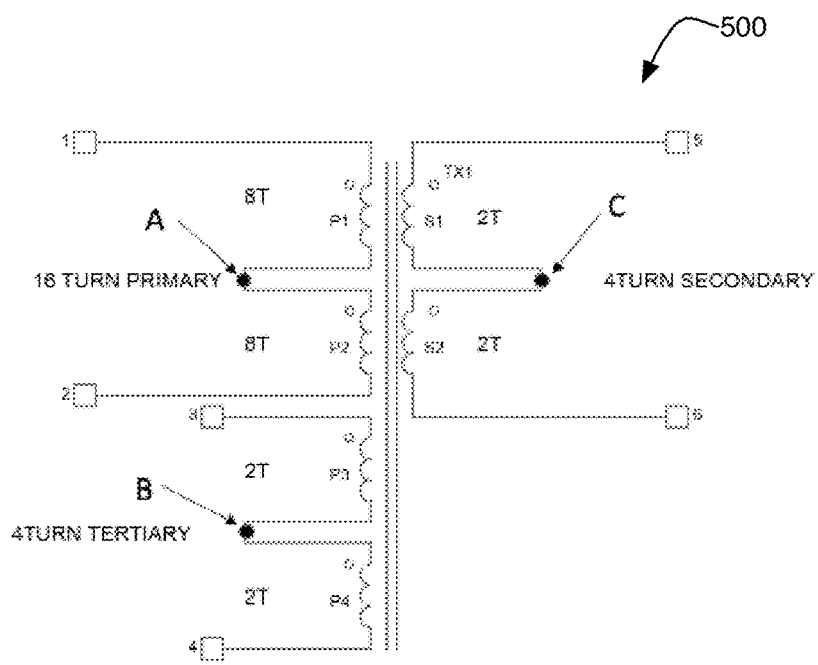
FIG. 5
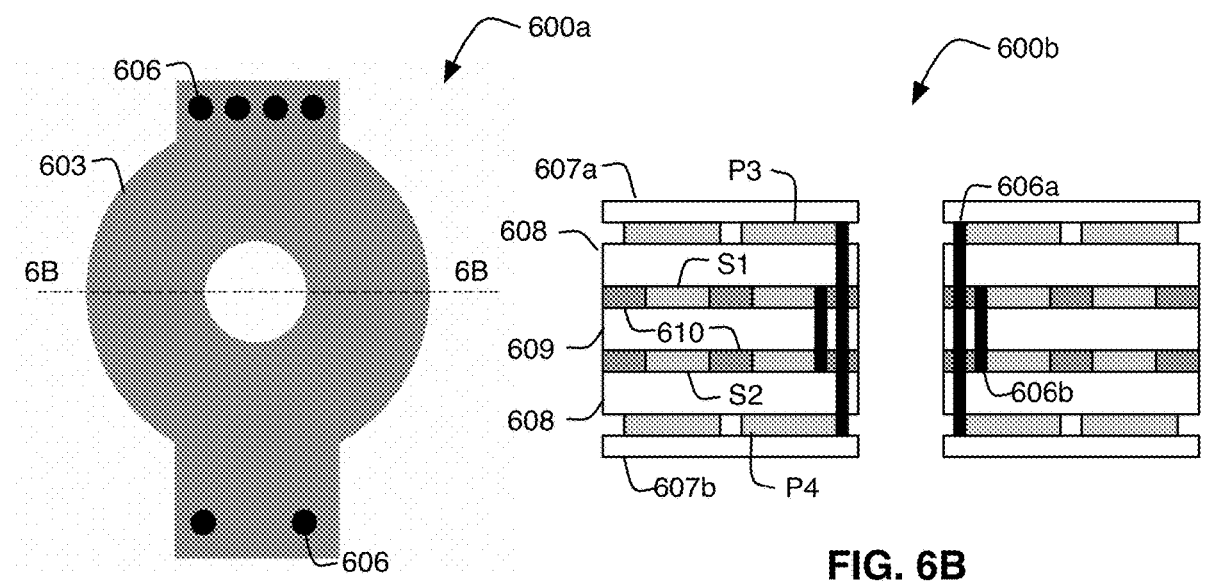
FIG. 6A
FIG. 6B

QUASI-PLANAR TRANSFORMER CONSTRUCTION

BACKGROUND

Flyback converters are an often-used power converter topology. Flyback converters include a flyback transformer that is actually a coupled inductor in the truest technical sense. A flyback transformer operates differently than traditional forward mode power transformers. For example, the primary and secondary windings of a flyback transformer conduct alternately rather than simultaneously. Additionally, an air gap may be introduced in the magnetic flux path to allow storage of energy.

SUMMARY

For various reasons including the above-described differences, conventionally constructed transformers may be suboptimal when employed in flyback converter applications. Disclosed herein are alternative transformer configurations and construction techniques that may result in improved transformers for flyback operations. Additionally, some aspects of these transformers and construction techniques may be applied to transformers used in non-flyback applications as well.

A quasi-planar transformer can include a first winding comprising one or more turns of wire, a second winding comprising one or more turns of a conductive trace disposed on a printed circuit board, and a magnetic core positioned with respect to the first and second windings so as to provide a magnetic flux path coupling the first and second windings. The first winding can be a primary winding having a first half wound in a clockwise direction on a first side of the printed circuit board and a second half wound in a counterclockwise direction on a second side of the printed circuit board, wherein the first and second halves are formed of a single continuous wire. The single continuous wire can pass through an opening in the printed circuit board. The first and second halves of the primary winding can be secured to the printed circuit board.

The second winding can be a secondary winding formed on a first plurality of layers of the printed circuit board, and the first plurality of layers can be interconnected by vias through at least the first plurality of layers of the printed circuit board. The quasi-planar transformer can further include a tertiary winding formed on a second plurality of layers of the printed circuit board and the second plurality of layers are interconnected by vias through at least the second plurality of layers of the printed circuit board.

The magnetic core can include an E-core and an I-core secured to the E-core, with the first and second windings disposed within a winding window defined by the E-core and the I-core. The magnetic core can include an air gap between a center leg of the E-core and the I-core.

The winding window defined by the E-core and the I-core can be taller than a height of an assembly comprising the first and second windings, and the assembly comprising the first and second windings can be disposed within the winding window away from the air gap. The quasi-planar transformer can further include a notch in a center leg of the E-core, and the printed circuit board can include a tab that fits within the notch. One or more vias connecting one or more layers of the printed circuit board can be disposed within the tab. The printed circuit board can further include a notch located adjacent the tab, and the notch can be dimensioned to define an opening for a continuous wire forming the first winding to pass through the printed circuit board. One or more inside corners of the E-core defining the winding window can be formed to include a curved channel.

A quasi-planar transformer can include a wound primary winding comprising one or more turns of a continuous piece of wire wound in a first direction on a first side of a printed circuit board and one or more turns of the continuous piece of wire wound in a second direction opposite the first direction on a second side of the printed circuit board, wherein the continuous piece of wire passes through the printed circuit board. The transformer can further include at least one printed winding comprising one or more turns of a conductive trace on the printed circuit board. The wound primary winding and the printed circuit board can be disposed within a magnetic core providing a magnetic flux path coupling the wound primary winding and the at least one printed winding.

The magnetic core can include an E-core having a center post that passes through the printed circuit board, the at least one printed winding, and the wound primary winding. A height of the center post of the E-core can define an air gap in the magnetic flux path, and the printed circuit board can be disposed within a core window defined by the E-core as far as practicable from the air gap. The E-core can define a slot, and the printed circuit board can define a tab disposed within the slot. The continuous piece of wire can pass through the printed circuit board at least partially within the slot. The continuous piece of wire can pass through the printed circuit board adjacent the slot.

The at least one printed winding can include a secondary winding formed on a first plurality of layers of the printed circuit board. The first plurality of layers can be interconnected by vias through at least the first plurality of layers of the printed circuit board. The vias through at least the first plurality of layers can be located in the tab. The at least one printed winding can further include a tertiary winding formed on a second plurality of layers of the printed circuit board. The second plurality of layers can be interconnected by vias through at least second plurality of layers of the printed circuit board. The vias through at least the second plurality of layers can be located in the tab. One or more inside corners of the E-core can be formed to include a curved channel.

A method of assembling a quasi-planar transformer can include passing a continuous wire through an opening in a printed circuit board having one or more printed circuit traces that define one or more printed circuit windings of the quasi-planar transformer, winding the continuous wire in a first direction to form a first half of a wire-wound winding on a first side of the printed circuit board, and winding the continuous wire in a second direction opposite the first to form a second half of the wire-wound winding on a second side of the printed circuit board. The method can further include securing the first and second halves of the winding to the printed circuit board. The continuous magnet wire can be self-bonding wire and securing the first and second halves of the winding can include applying heat to the assembly.

The method can further include disposing an assembly including the printed circuit board and the first and second winding halves within a magnetic core that provides a flux path between the wire-wound winding and the one or more printed circuit windings. The magnetic core can define an air gap and disposing the assembly including the printed circuit board and the first and second winding halves within the magnetic core comprises positioning and securing the assembly as far as practicable from the air gap within a window defined by the magnetic core. The method can further include disposing an assembly including the printed circuit board and the first and second winding halves within a magnetic core that provides a flux path between the wire-wound winding and the one or more printed circuit windings. The magnetic core can define an air gap and disposing the assembly including the printed circuit board and the first and second winding halves within the magnetic core can further include positioning and securing the assembly as far as practicable from the air gap within a window defined by the magnetic core.

A quasi-planar transformer can be assembled according to any of the above-described methods. The one or more printed circuit windings can include a secondary winding formed on a first plurality of layers of the printed circuit board, and the first plurality of layers can be interconnected by vias through at least the first plurality of layers of the printed circuit board. The one or more printed circuit windings can include a tertiary winding formed on a second plurality of layers of the printed circuit board, and the second plurality of layers are interconnected by vias through at least the second plurality of layers of the printed circuit board.

The quasi-planar transformer assembled by the above-described methods can include a magnetic core including an E-core and an I-core secured to the E-core, with the first and second windings disposed within a winding window defined by the E-core and the I-core. The magnetic core can define an air gap between a center leg of the E-core and the I-core. A winding window defined by the E-core and the I-core can be taller than a height of an assembly comprising the first and second windings. The assembly including the first and second windings can be disposed within the winding window away from the air gap. The E-core can define a notch in a center leg of the E-core, and the printed circuit board can include a tab that fits within the notch. One or more vias connecting one or more layers of the printed circuit board can be disposed within the tab. The printed circuit board can further include a notch located adjacent the tab. The notch can be dimensioned to define an opening for a continuous wire forming the first winding to pass through the printed circuit board. One or more inside corners of the E-core defining the winding window can be formed to include a curved channel.

A magnetic core for use with a printed circuit board transformer can include one or more inside corners of the magnetic core formed to include a curved channel that serves as a strain relief and facilitates positioning a printed circuit board within a core window defined by the core. The magnetic core can be an E-core. A center post of the E-core can define a notch configured to receive a complementary tab of a printed circuit board of the printed circuit board transformer. A center post of the E-core can be shorter than outside legs of the E-core, so that when assembled with an I-core a resulting core has an air gap. The core can be made of a ferrite material. A printed circuit board transformer can include a printed circuit board having one or more turns of a conductive trace disposed thereon and a magnetic core as described above.

BRIEF DESCRIPTION OF THE DRAWINGS

FIG. 5 illustrates a schematic diagram of a quasi-planar transformer.
FIGS. 6A-6B illustrate plan and sectional views of a quasi-planar transformer PCB assembly.

DETAILED DESCRIPTION

Figure 1:
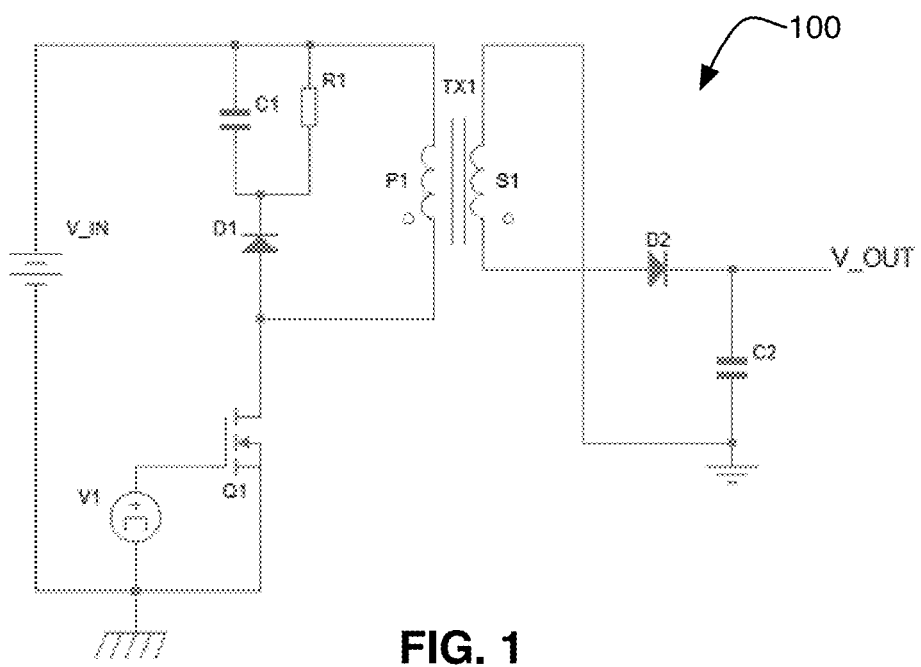
FIG. 1 illustrates a schematic diagram of an exemplary flyback converter.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 shows an exemplary flyback converter 100 with its coupled inductor TX1, also known as the "flyback transformer," which includes a primary winding P1 and a secondary winding S1. An air gap may be introduced in the magnetic path of the flyback transformer core to achieve desired inductance for energy storage. In operation, the flyback transformer current ramps up in the primary winding P1 when switch Q1 is closed. When Q1 turns off, energy is transferred to output load via V_OUT bus through secondary winding S1 and rectifier diode D2. Filter capacitor C2 can be used to smoothen the output DC bus. A clamp circuit including capacitor C1, diode D1, and resistor R1 may be used to dissipate energy stored in the leakage inductance to limit the voltage spike resulting from the switching operation. In some designs, active clamp circuits can be used to recover some energy that would otherwise be lost as a result of the above-described operation. The illustrated flyback converter is exemplary, and variations on the illustrated configuration is possible. However, these variations and detailed operation of flyback converters is beyond the scope of this document.

Flyback transformer TX1 is an important element of the flyback converter. In some applications, several auxiliary windings may also wound on the same core in addition to the above-described primary winding P1 and secondary winding S2. These auxiliary windings can be used, for example, to provide various internal DC bias voltages for control circuitry. Flyback transformers may also include one or more "dummy" shield windings to reduce circulating common mode current, which may be useful, for example, to meet electromagnetic interference ("EMI") compliance requirements. For purposes of this disclosure, such auxiliary windings and "dummy" shield windings are described as "tertiary windings." Additionally, reinforced insulation may be provided between the primary and secondary side windings to meet various agency safety requirements, for example the requirements of organizations such as Underwriters Laboratories (UL). In some applications, this can be achieved by use of triple insulated wires or margin tape winding and multiple layers of insulation tapes at the isolation boundary. Additionally or alternatively, there are several well-known safety agency approved insulation systems in the area of transformer design.

Because of these and other design complexities, the cost of wire wound transformers has continued to rise significantly. Much of the cost is associated with the winding process rather than the materials. With labor costs continuing to rise, in many cases the transformer can be the most expensive part of a flyback converter. In addition to these cost issues, wire wound transformers can also have larger variations in parameters such as leakage inductance and parasitic capacitance. This variation can cause corresponding variation in efficiency and EMI performance of the flyback converter.

Figure 2:
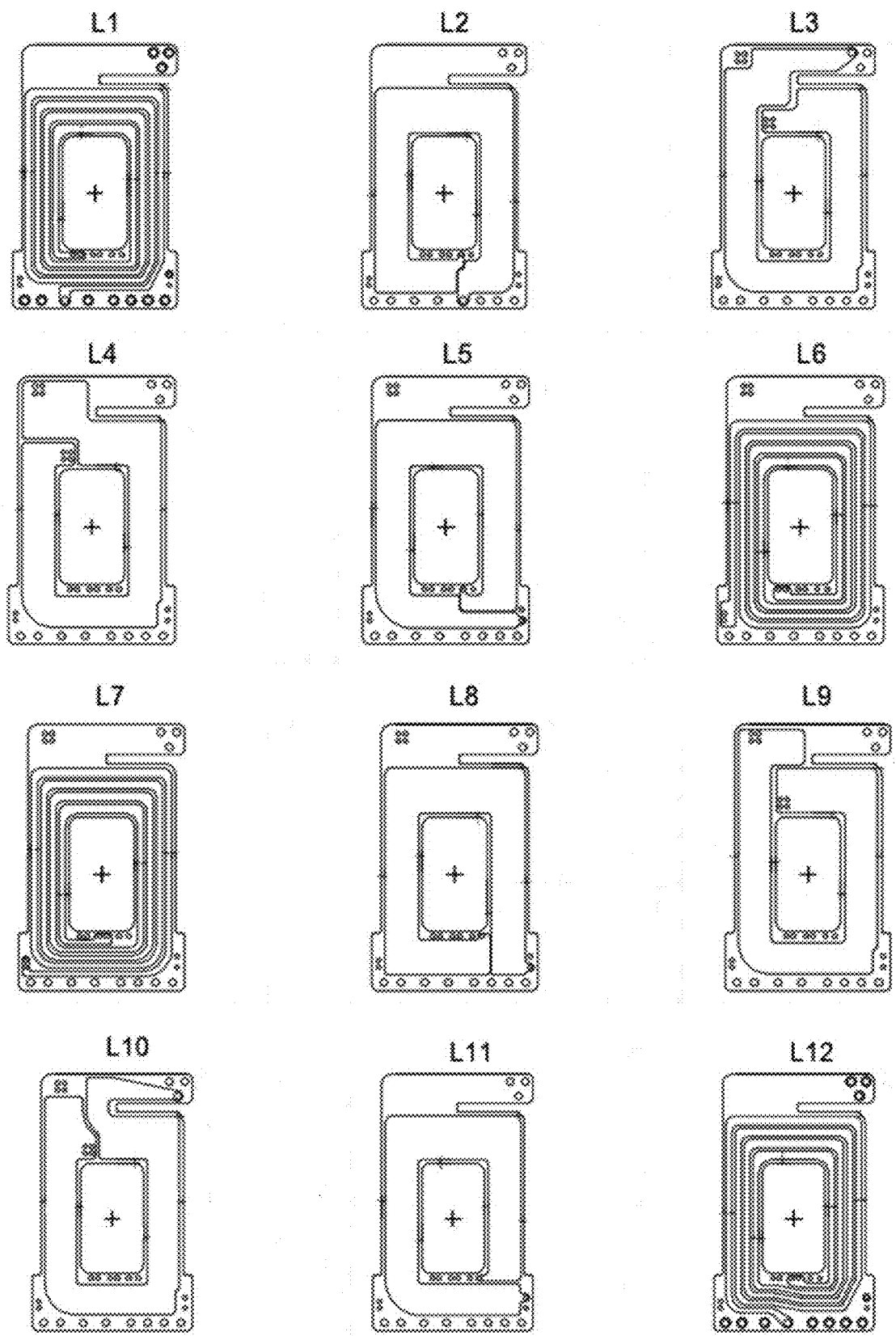
FIG. 2 illustrates PCB layers of a planar transformer.

As distinguished from wire-wound transformers, planar transformers employ multi-layer printed circuit boards ("PCBs") to form the windings. Reinforced insulation can be provided between the primary and secondary windings using PCB core materials or thick resin layers (colloquially known as pre-preg). Primary and secondary winding turns can be formed by copper traces of specific widths along the magnetic path. FIG. 2 shows an example of a 12-layer PCB that could be used in a flyback transformer. The illustrated transformer uses multiple levels of interleaving. The winding structure in the above example is as follows:

Layers L3, L4, L9 and L10 feature the secondary winding (S1) traces. Each layer includes one turn, and traces in these four layers are connected in series through plated vias to form a 4-turn secondary winding.

Layers L2, L5, L8 and L11 feature the tertiary winding traces. Each layer includes one turn, and traces in these four layers are connected in series through vias to form a 4-turn tertiary winding.

Layers L1, L6, L7 and L12 feature the primary winding (P1) traces. Each layer includes 4 turns, and they are connected in series to form a 16-turn primary winding.

Figure 3:
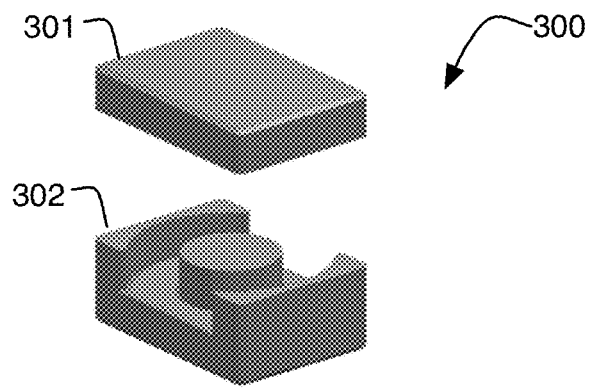
FIG. 3 illustrates a magnetic core for a planar transformer.

The PCB described above with reference to FIG. 2 can be placed in a suitable ferrite core to form a flyback transformer. FIG. 3 illustrates an exemplary ferrite core 300, which includes an E-type core 302 (so-named because of its E-shaped cross section) and an I-core or plate 301 (also named by reference to its shape). The core may be configured so that there is an air gap between the center post of E-core 302 and the surface of I-core 301 to provide the desired magnetic properties (i.e., inductance) for energy storage in the flyback transformer application. Alternatively, for other applications, a planar transformer can be constructed without this gap.

Figure 4:
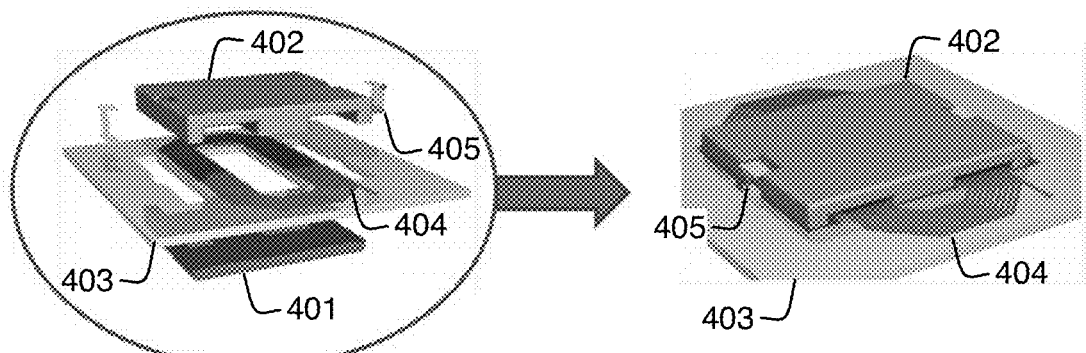
FIG. 4 illustrates assembly of a planar transformer.

FIG. 4 illustrates assembly of an exemplary planar transformer. Windings 404 may be formed on a printed circuit board 403. Printed circuit board 403 may include slots to allow E-core 402 and I-core 401 to be disposed around the windings. The cores may be secured with glue, the illustrated spring clips 405, or other suitable means. Copper pins or pins from another conductive material (not shown in FIG. 4, but illustrated below in FIGS. 7-9) may be inserted in termination holes for interconnection, and the structure may be wrapped in polyester tape for integrity. Also, various geometries of cores can be used in such planar transformer designs, including, for example, EQ, EE, EP, etc.

Planar transformers, such as those described above can deliver a compact and low-profile flyback transformer that is simple, and therefore relatively inexpensive to build. However, such planar transformer designs can suffer from high eddy current losses. More specifically, because in a flyback converter the primary and secondary windings conduct alternately, there is always a non-conducting winding in proximity to a conducting winding. Because in a planar transformer design the windings typically use relatively wide PCB traces, the non-conducting winding can suffers from high eddy current losses. Additionally, in flyback transformer applications, the magnetic field in the air gap can cause current flow in the restricted area of all the windings, further increasing losses. Thus, although such planar transformer designs offer simple and cost-effective construction, they can be inefficient because of these (and potentially other) losses.

To potentially overcome these deficiencies of prior art planar transformers, while still achieving the cost and simplicity benefits associated with the planar design, a quasi-planar transformer design, as described in greater detail below, may be employed. A quasi-planar flyback transformer can use a multi-layer PCB similar to what is used in traditional planar transformers for the secondary and tertiary windings in combination with a magnet wire wound primary winding. The magnet wire can be Litz-type wire to reduce high frequency losses in the primary. The PCB can incorporate reinforced insulation by using cemented joint(s) for the secondary winding. In at least some embodiments, a continuous primary winding, without any joint, can form an interleaved or sandwiched winding (as described in greater detail below). In other words, the PCB containing the secondary (and tertiary) windings can sandwiched between two halves of the primary winding without needing any physical connection or joint between the two halves of the primary.

The following description explains the construction of an exemplary quasi-planar transformer. FIG. 5 illustrates an exemplary schematic diagram of the quasi-planar transformer 500. The primary winding can have 16 turns, split in two equal parts in P1 and P2, each having 8 turns. (Other numbers of turns may be used depending on the requirements of a particular application.) The center point between P1 and P2 is shown as A. As noted above, the primary winding may be continuous, such that A is not a connection, but merely a midpoint of the winding. A tertiary winding (e.g., a bias supply winding) can have 4 turns, split in two equal parts P3 and P4, each consisting of 2 turns. (Other numbers of turns may be used depending on the requirements of a particular application.) The center point of the connection between P3 and P4 is shown as B. The secondary winding can have 4 turns, split in two equal parts S1 and S2, each consisting of 2 turns. (Other numbers of turns may be used depending on the requirements of a particular application.) The center point of the connection between S1 and S2 is shown as C. Connections B and C may be made through vias in the printed circuit board as described in greater detail below.

FIG. 6A illustrates a plan view 600a of an exemplary PCB 603, and FIG. 6B illustrates a sectional view through PCB 603. In the illustrated example, a four-layer PCB can be used to house the secondary and tertiary windings. In other embodiments, more or fewer layers may be appropriate depending on the particular winding design, which can include more layers, more turns per layer, etc. In any case, in this example, second and third PCB layers can include the windings S1 and S2, while first and fourth PCB layers can include tertiary windings P3 and P4. The nodes B and C can be formed using plated through vias 606. Such that via 606b for connection C passes only through—the second and third layers and is otherwise buried inside PCB 603. In other words, via C is not seen in outer layers of PCB 603, thereby meeting reinforced insulation requirements of various safety agencies. Additionally, the traces of primary windings S1 and S2 may be kept away from the PCB edges and from via 606a for connection B by a certain minimum distance, which may be specified by the various safety agencies. Via 606a for connection B can pass through all four PCB layers but a minimum separation distance d can be provided between this via and traces of S1 and S2 as well as via 606b for connection C. The above-described construction is exemplary only, as there are numerous alternate ways to construct such a PCB while meeting appropriate safety requirements.

Turning now to FIG. 6B, a cross-sectional view 600b is illustrated. Beginning from the top, layer 607a can be an additional insulation layer apart from the PCB itself, such as an insulating tape. This insulation layer can provide insulation for the winding layer P3 (the "first" layer described above) from components external to the PCB. As can be seen, via 606a connects this first layer (tertiary winding P3) with the fourth/bottom layer with tertiary winding P4. Below the PCB layer with tertiary winding P3 is an insulating layer 608, below which is the "second" PCB layer described above, which includes secondary winding S1 and insulation 610. Below this layer is a further insulation layer 609, followed by the above-described "third" PCB layer, which includes secondary winding S2 and insulation 610. As illustrated via 606b for connection C between the secondary winding halves S1 and S2 passes only through the necessary interior layers. Further down is additional insulation layer 608, below which is the above-described "fourth" PCB layer including tertiary winding P4. As can be seen, via 606a connects the "first" and "fourth" PCB layers through all intermediate layers.

The material thickness of the reinforced insulation layers 608 and 609 may be dictated by various safety agencies. For example, for UL reinforced insulation requirement, the thickness is required to be >0.4 mm if a single layer pre-preg is used. Or three separate thinner pre-preg layers can be stacked to meet the requirement, if each layer is approved as basic insulator. The width of the void free sealing along the edge of the PCB may need to have required width specified by a relevant safety agency. This cemented joint may also need to be certified by such safety agency. In any case, well-known processes have been established in the industry to make such multi-layer PCB that meet applicable reinforced insulation requirements.

As noted above, the quasi-planar transformer can include a continuous primary winding, split in two equal parts sandwiching the PCB assembly. To achieve this, the magnet cire can be passed through an opening through the PCB assembly created for the center leg of the core. This can be accomplished, for example, by incorporating a slot along the perimeter of the inner profile of the PCB. There are multiple possible configurations, and a few examples are illustrated in FIGS. 7A, 7B, and 7C.

Figure 7A:
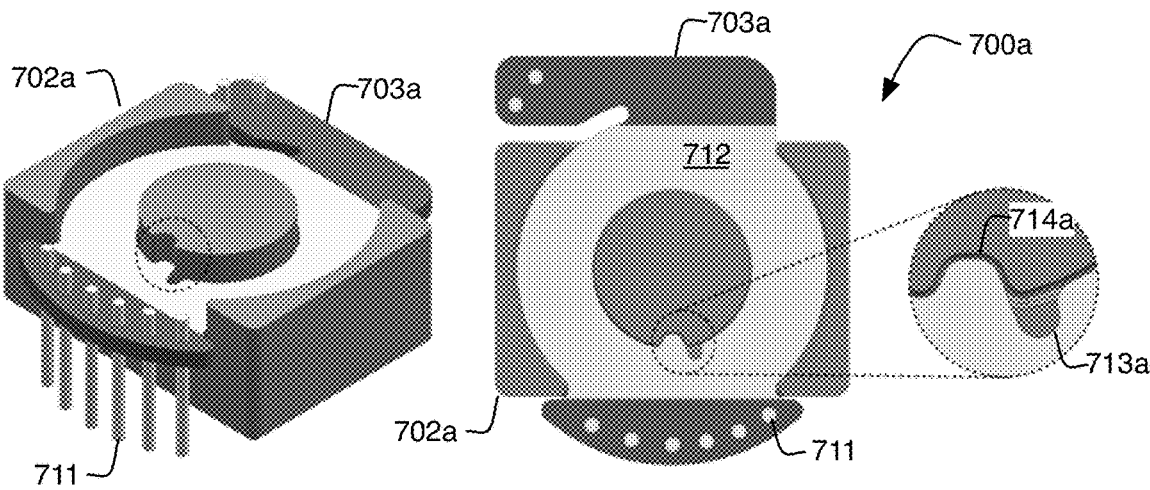
FIGS. 7A-7C illustrate various arrangements for passing a magnet wire for a wound primary winding through a PCB assembly of a quasi-planar transformer.

FIG. 7A illustrates a first configuration 700a in which PCB assembly 703a is disposed in E-core 702a. (FIG. 7A also illustrates interconnection pins 711 mentioned above with respect to FIG. 4, which are disposed in termination holes in PCB assembly 703a.) Also illustrated is additional insulation layer 712 (denoted as 607a/607b with reference to FIG. 6B). As most clearly seen in the enlarged area, core 702a may have a slot 714a formed therein for reasons described in greater detail below with reference to FIG. 12. A rectangular slot 713a in PCB assembly 703a having a width and depth at least as large as the maximum diameter of the primary magnet wire may also be provided, allowing the magnet wire to pass through the hole in the interior of PCB assembly 703a as illustrated in greater detail below with respect to FIGS. 8A-8D.

Figure 7B:
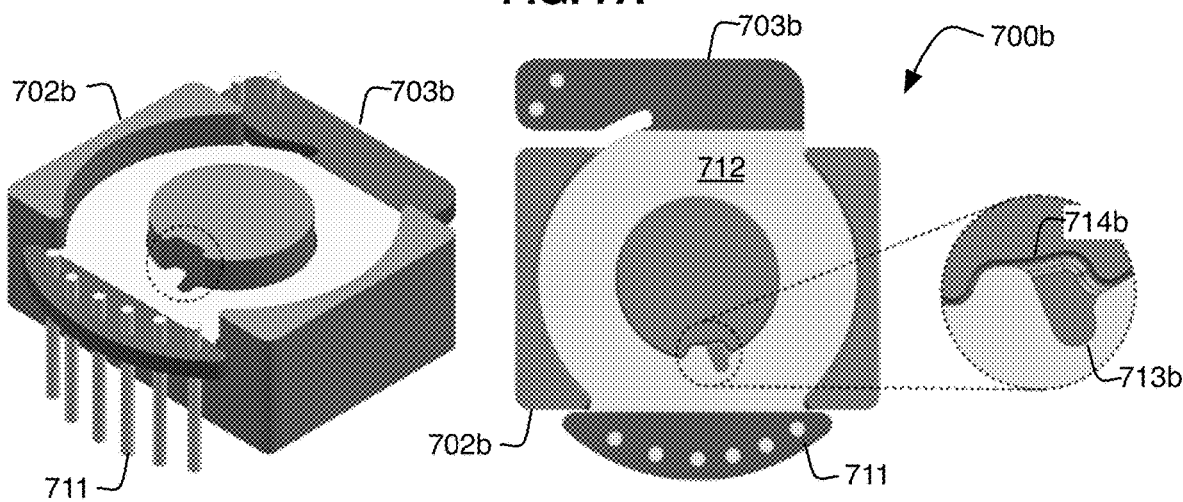

FIG. 7B illustrates a second configuration 700b in which PCB assembly 703b is disposed in E-core 702b. (FIG. 7B also illustrates interconnection pins 711 mentioned above with respect to FIG. 4, which are disposed in termination holes in PCB assembly 703b.) Also illustrated is additional insulation layer 712 (denoted as 607a/607b with reference to FIG. 6B). As most clearly seen in the enlarged area, core 702b may have a slot 714b formed therein for reasons described in greater detail below with reference to FIG. 12. A cut out 713b in PCB assembly 703a together with a portion of core slot 714b can have a combined width is at least as large as the maximum diameter of the primary magnet wire may also be provided, allowing the magnet wire to pass through the hole in the center of PCB assembly 703b as illustrated in greater detail below with respect to FIGS. 8A-8D.

Figure 7C:
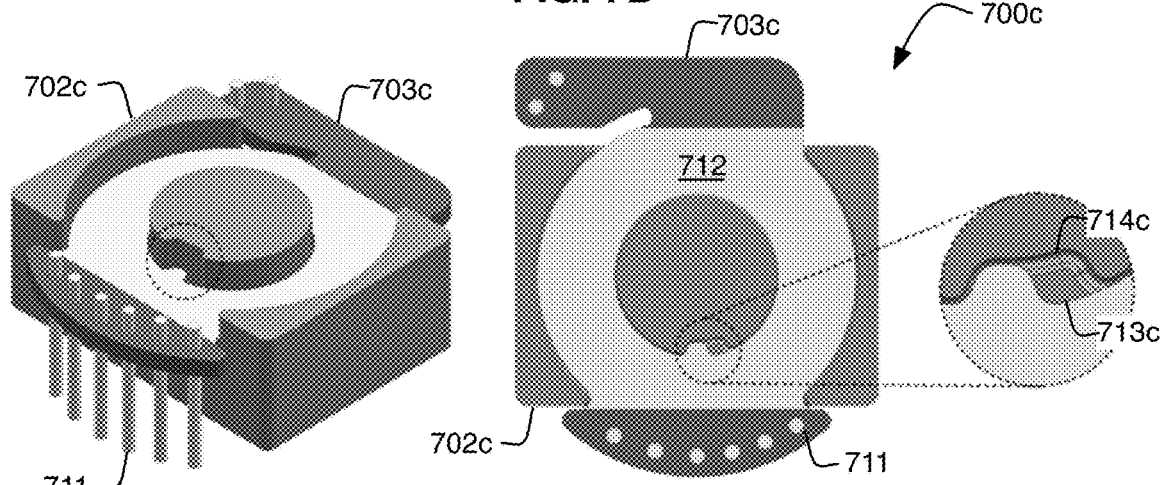

FIG. 7C illustrates a third configuration 700c in which PCB assembly 703c is disposed in E-core 702c. (FIG. 7C also illustrates interconnection pins 711 mentioned above with respect to FIG. 4, which are disposed in termination holes in PCB assembly 703c.) Also illustrated is additional insulation layer 712 (denoted as 607a/607b with reference to FIG. 6B). As most clearly seen in the enlarged area, core 702c may have a slot 714c formed therein for reasons described in greater detail below with reference to FIG. 12. A rectangular slot 714c in the center post of core 702c can have a depth greater than the maximum diameter of the primary magnet wire, allowing the magnet wire to pass through the hole in the center of PCB assembly 703c as illustrated in greater detail below with respect to FIGS. 8A-8D.

The above-described arrangements are exemplary only, and there are many alternate configurations that can achieve the same objective of passing the magnet wire through the PCB.

Figure 8A:
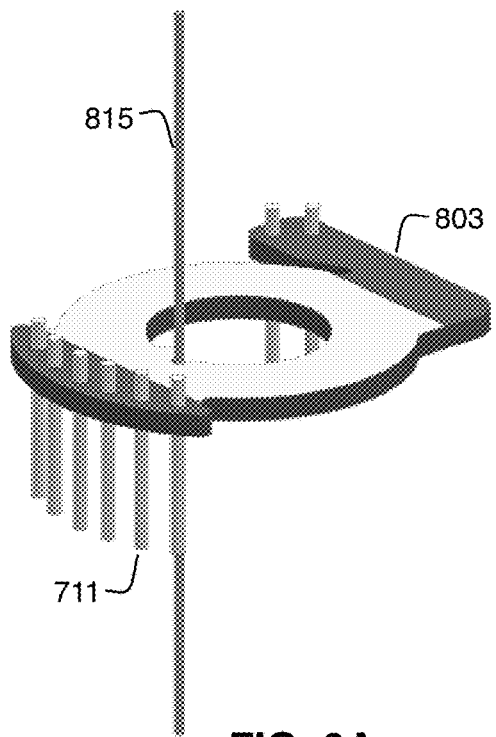
FIGS. 8A-8D illustrate construction of a wound primary winding for a quasi-planar transformer.
Figure 8B:
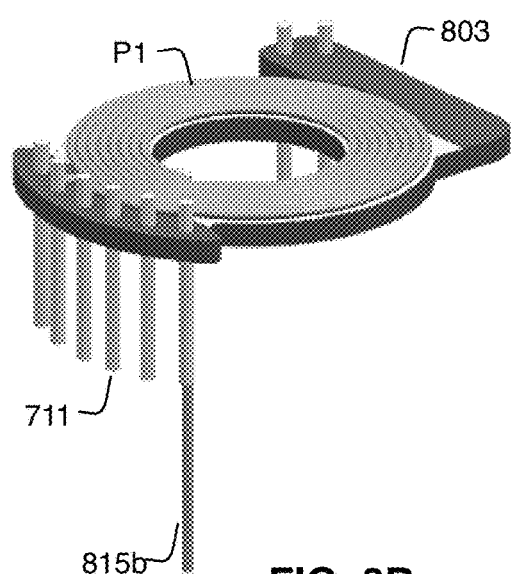

FIGS. 8A-8D illustrate construction of a wound primary winding for a quasi-planar transformer. Beginning with FIG. 8A, magnet wire 815 for the primary winding can be passed through PCB assembly 803, for example using an access space as described above with respect to FIGS. 7A-7C. A sufficient wire length may be left at both ends (i.e., on either side of PCB assembly 803) to allow for winding the respective halves P1 and P2 of the primary winding. As shown in FIG. 8B, primary coil P1 can be wound on a first side of PCB assembly 803 such that the inner diameter of the coil is no less than the inner diameter of the PCB opening (for the center post of the core) and the outer diameter of the coil does not extend beyond the outer edge of the PCB. In the illustrated example, the coil, PCB assembly, and opening through the PCB are circular in cross section, but other shapes could be used as appropriate, in which case the inner diameters described above may be understood as describing the size of area circumscribed by the coil and/or the opening through the PCB. In any case, a particular winding direction or phase (e.g., clockwise or counterclockwise) should be maintained for the P1 coil winding.

Figure 8C:
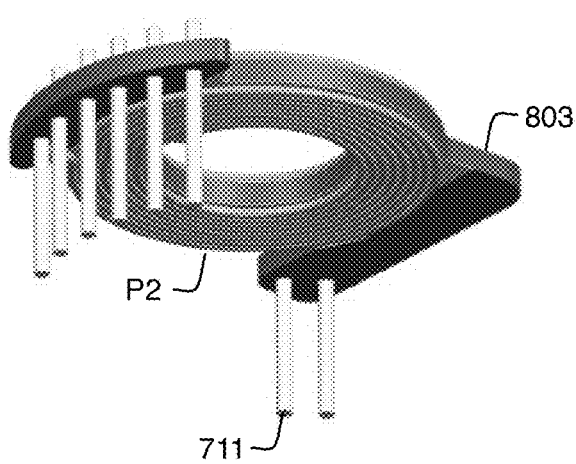

As shown in FIG. 8B, the formed coil P1 coil can be pressed on the surface of PCB assembly 803 surface by pulling the free wire end 815b. Then, as illustrated in FIG. 8C, another primary coil P2 can wound on the other side of PCB 803. Coil P2 can be would with an opposite direction or phase with respect to the first coil P1. Thus, if P1 was wound clockwise, P2 can be wound counterclockwise, and vice-versa. The length of the free wire can be selected such that after completing the necessary number of turns for winding P2, coil P2 sits flush on PCB 803, as illustrated in FIG. 8C. As a result, a continuous primary winding is formed with natural series connection of the two windings P1 and P2 without any joint because they are formed from the same continuous length of wire. Both primary windings, P1 and P2, can be glued to PCB 803 to keep them in a fixed position using various techniques. One such exemplary technique could be to use self-bonding wire, which causes the wire to stick to adjacent turns and PCB 803 after applying heat. The heat can be applied during the winding process or as a post process. Several winding techniques can achieve required winding stack through automated processes.

Figure 8D:
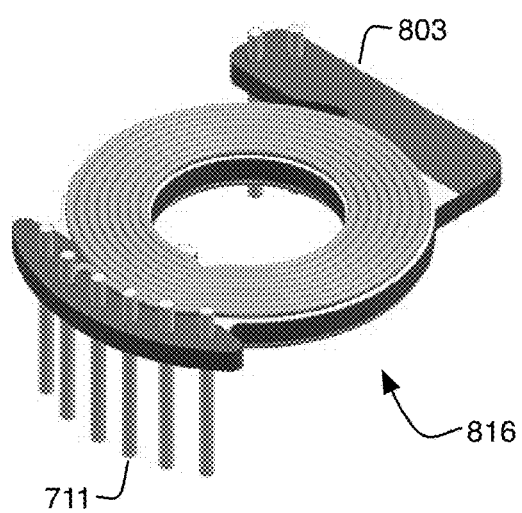

Using insulated magnet wire can simplify the assembly process and eliminate the requirement multiple discrete insulators to prevent the breakdown of the insulation between the primary winding and the core. One such type of wire is PFA wire, which uses a basic insulation layer of excellent tensile strength. Alternately, a magnet wire can be used with a discrete insulation mechanism. In any case, the finished coil/PCB assembly 816 is illustrated in FIG. 8D, including connections between the windings and appropriate interconnection pins 711, as needed.

Figure 9:
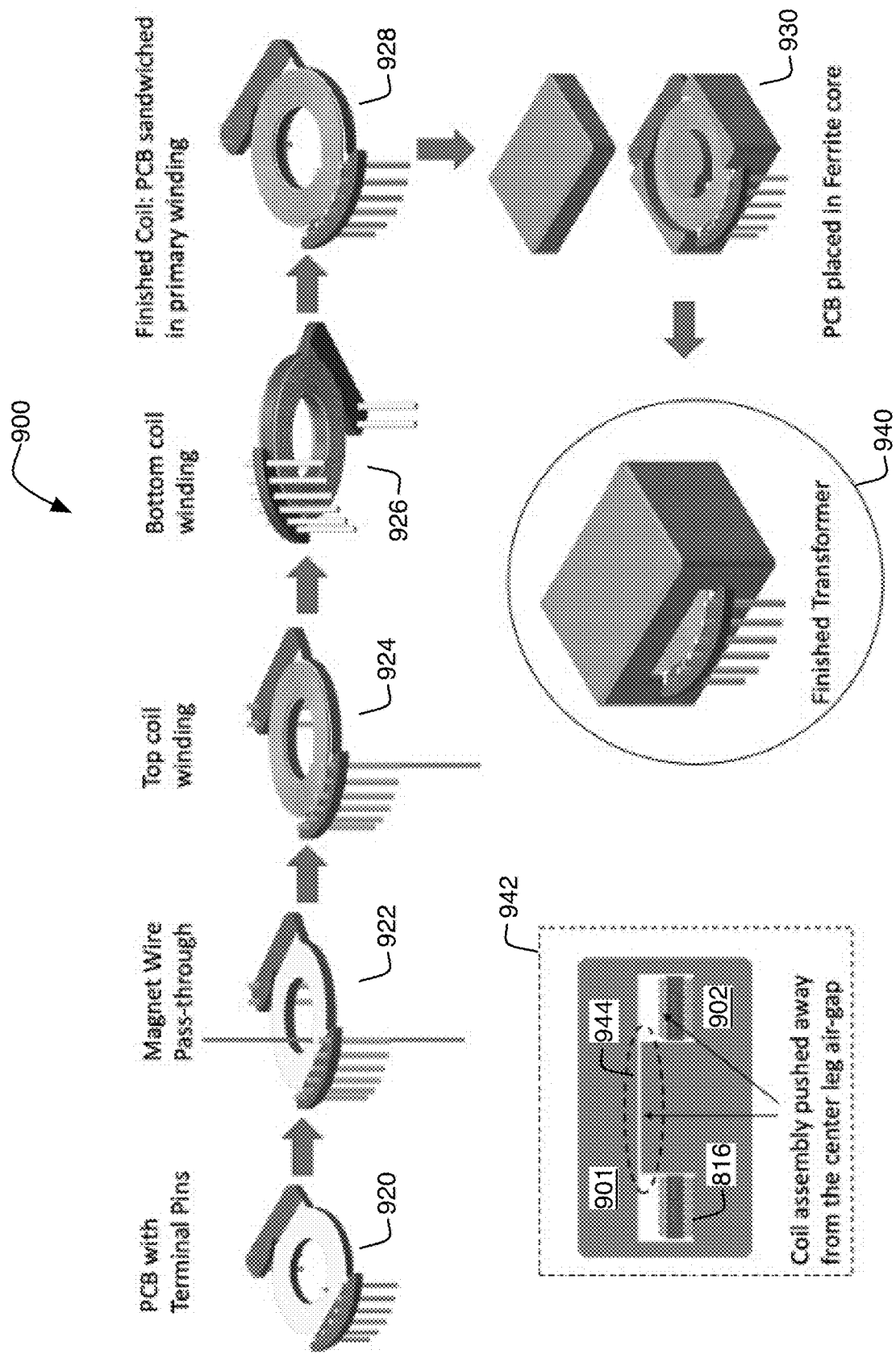
FIG. 9 illustrates construction of a quasi-planar transformer.

FIG. 9 illustrates the assembly/construction process 900 for a quasi-planar transformer as described above. To start, the PCB assembly with terminal pins (920) can have a magnet wire passed through (922) as described above with respect to FIG. 8A. Then, one side of the primary coil (P1) can be wound (924), followed by the other side primary coil (P2) being wound (926) in the opposite direction. This produces (928) a PCB assembly 816 that can then be placed within a core (930), with the core halves being secured by appropriate means to produce the final transformer 940. If the primary wire is not insulated, then an external insulator 607a/607b/712 can be used between the primary coil and ferrite core. If the primary wire is insulated, this external insulator may optionally be omitted.

With reference to block 942 of FIG. 9, if the coil assembly 816 is placed very close to the air gap 944 in the center leg of the magnetic core, high eddy current losses may result. Hence the window height of the E core can be selected to be longer than the thickness of the coil assembly. (The window height is effectively defined by the inside lengths of the top and bottom legs of E-core 902, which mate with I-core 901. The center leg of E-core 902 can be shorter than these outer legs to define air gap 944, discussed in greater detail below with respect to FIGS. 10A and 10B.) By selecting a window height for the E-core that is greater than the height of coil assembly 816, the coil assembly can be pushed down to the "bottom" surface of the core window, maximizing the distance from and preventing it moving closer to air gap 944. In some embodiments, a compressible foam pad could be used for this purpose, or coil assembly 816 can be glued to the bottom surface of the E core. In other cases, coil assembly 816 and E-core 902 may have dimensions that allow for a friction/interference fit to secure coil assembly 816 at the "bottom" of the core window. (As described above, "bottom" refers to the orientation as shown in FIG. 9, and could be any orientation in an actual physical embodiment. The point is that PCB assembly 816 should be disposed in the core to be as far as practicable from air gap 944.)

After placing the I core 901, the combined core assembly can be secured by tape or glue, or by retaining clips as discussed above with respect to FIG. 4. It should also be noted that the shape of the PCB and primary winding can be circular, elliptical, square, or rectangular (or any other suitable shape) depending upon the choice of core geometry. Additionally, the illustrated example (and other embodiments herein) show a PCB dedicated to the quasi-planar transformer, but the PCB assembly could also include other components. In such configuration, connection pins 711 may not be necessary, and connections from the coils to other components may be made using PCB traces, vias, or other interconnection techniques.

Figure 10A:
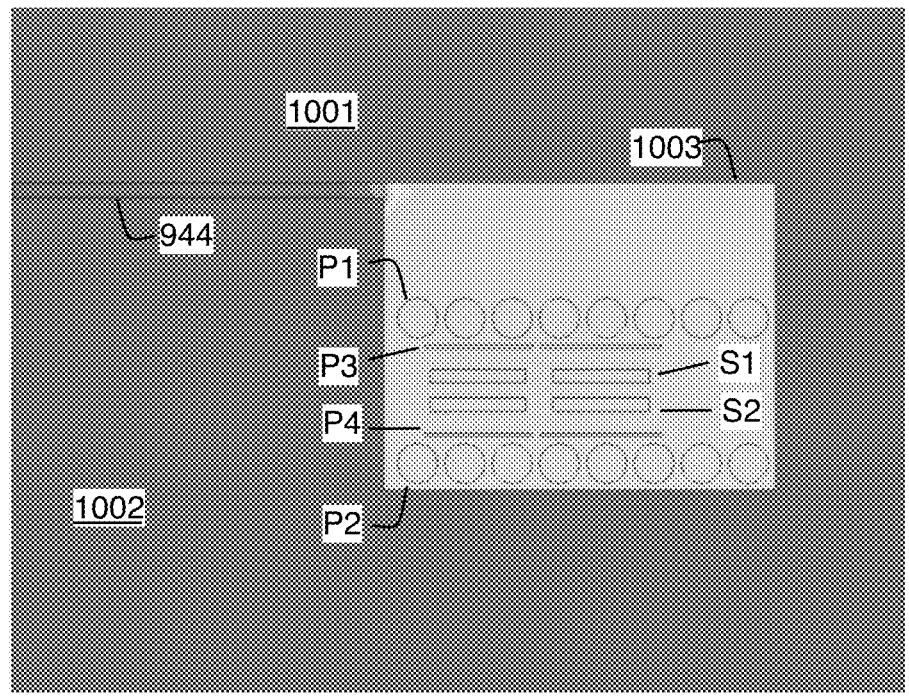
FIGS. 10A-10B illustrate magnetic flux associated with a quasi-planar flyback transformer.
Figure 10B:
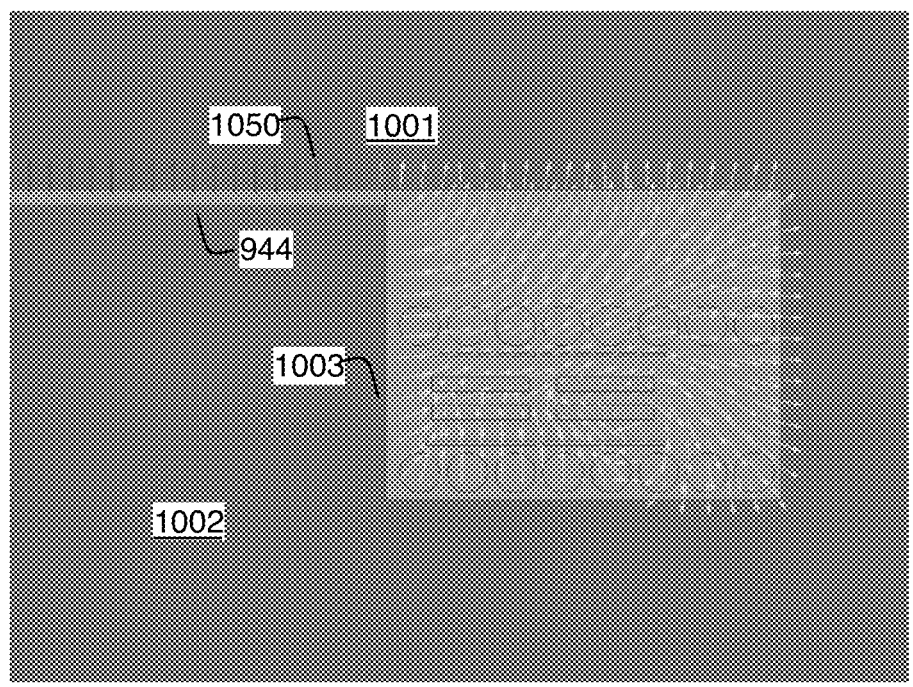

FIGS. 10A and 10B show a cross sectional view of half of a quasi-planar transformer as described above. E-core 1002 and I-core 1001 are joined, forming air gap 944. Disposed within core window 1003 are primary windings P1 and P2, tertiary windings P3 and P4, and secondary windings S1 and S2, all of which may be configured as described above. FIG. 10A illustrates the intensity of fringing flux originating from air-gap 944 in the center leg of E-core 1002, with the strongest flux being in the air gap 944, decreasing rapidly where air gap 944 meets core window 1003, and continuing to decrease gradually across core window 1003 as moving away from air gap 944. FIG. 10B illustrates the directional vectors 1050 of this fringing flux. This flux effect can cause current in the windings to pull towards the top surface, and thus increase the effective AC resistance of the winding, which in turn increases the power loss. ("Top" in this context again refers to the orientation of FIGS. 10A-10B and could be any actual orientation in a physical embodiment.) To avoid or minimize this effect, the coil assembly can be kept as far away from air gap 944 as practicable. However, this spacing can be optimized to provide the best performance of the flyback transformer for a given design/application.

More specifically, the optimum spacing depends upon various design factors, including for example the size of the wire used, operating flux density, and copper loss to core loss ratio in the given design. To increase this space, a taller core can to be used. The coil can then be pushed to the "bottom" side of the core window, and with increasing height of the core, the space between the coil and air gap 944 increases. This can help reduce the impact of the fringing flux on the coil. However, increasing height of the core adds to the volume of the core, which can result in higher core loss. A given quasi-planar transformer design can be optimized such that copper losses are reduced to optimum level without excessive increase in core losses. At this particular spacing, the best compromise between reduced copper losses and increased core losses is achieved. For any given design, the appropriate spacing can be determined through magnetic simulations or through experimentation in the environment of the actual power converter design.

Figure 11:
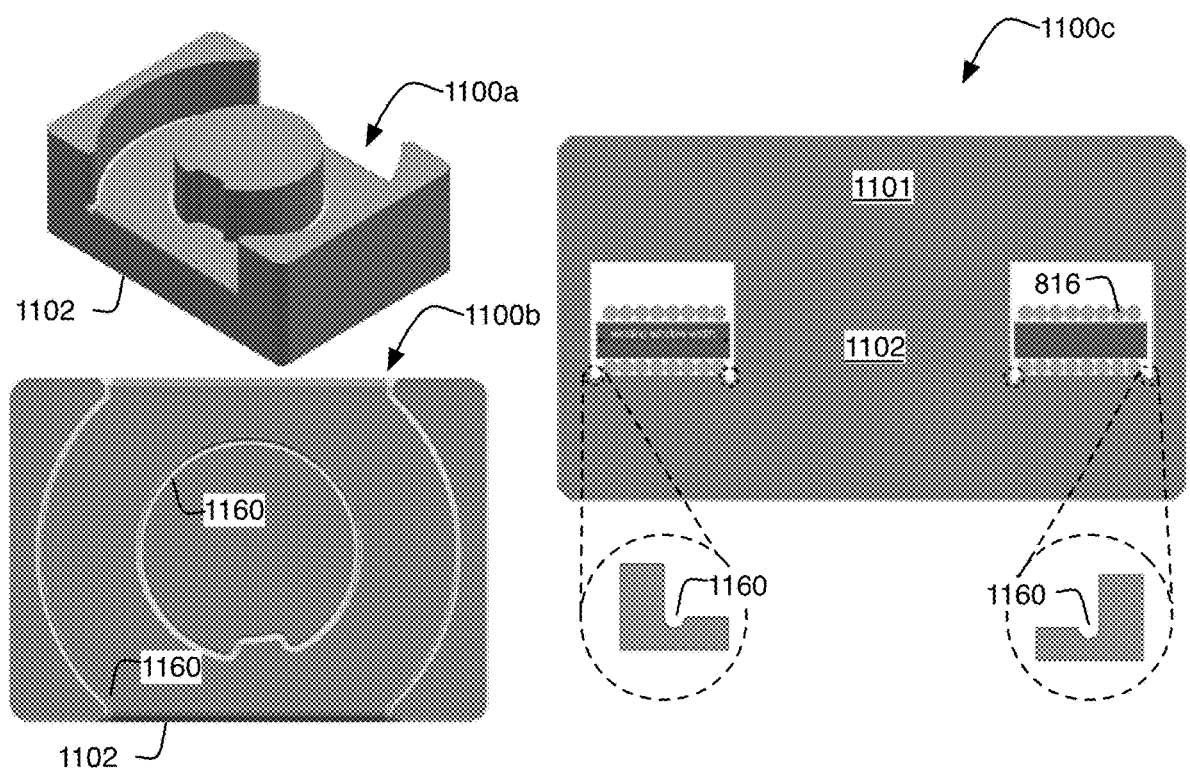
FIG. 11 illustrates a core configuration for a planar transformer, including but not limited to a quasi-planar transformer.

FIG. 11 illustrates E-core 1102 in isometric view 1100*a*, plan view 1100*b*, and sectional view 1100*c*. (The sectional view 1100*c* includes PCB assembly 816 disposed within the core window, and also shows I-core 1101 in position, although air gap 944 has been omitted.) More specifically, FIG. 11 illustrates a core construction technique that may be employed to maximize the core window width while not compromising the mechanical robustness of the ferrite core. Practical manufacturing techniques for such cores do not allow for sharp 90 degree corners, particularly inside corners, such as those defining the core windows. As a result, the chamfer or curved blend between the "vertical" and "horizontal" sides of the core window can prevent coil assembly 816 from resting on the "bottom" of the core window. (As above, the terms "vertical," "horizontal," and "bottom" refer to the orientation of FIG. 11 and not necessarily to orientation in a physical embodiment. To accommodate this, the window can be made wider than necessary, so that on the bottom surface, there is enough room between the chamfers/curved blends to allow for PCB assembly to sit on the bottom of the core window. As an alternative, a curved channel 1160 can be formed at the inner edges of the core. This can allow the clearance between the PCB assembly width to interior ferrite core window width to be reduced while also avoiding stress concentrations associated with sharp edges of the ferrite core. The additional effective width of the core window that will still allow the PCB assembly to rest securely on the bottom of the core window can allow for wider PCB width, in turn allowing for wider traces on the PCB, reducing trace resistance and helping to achieve higher efficiency. Additionally, this core construction technique need not be limited to quasi-planar arrangements as described above with respect to FIGS. 5-10, but may also be used in conjunction with conventional planar transformers as described above with respect to FIGS. 2-4.

Figure 12:
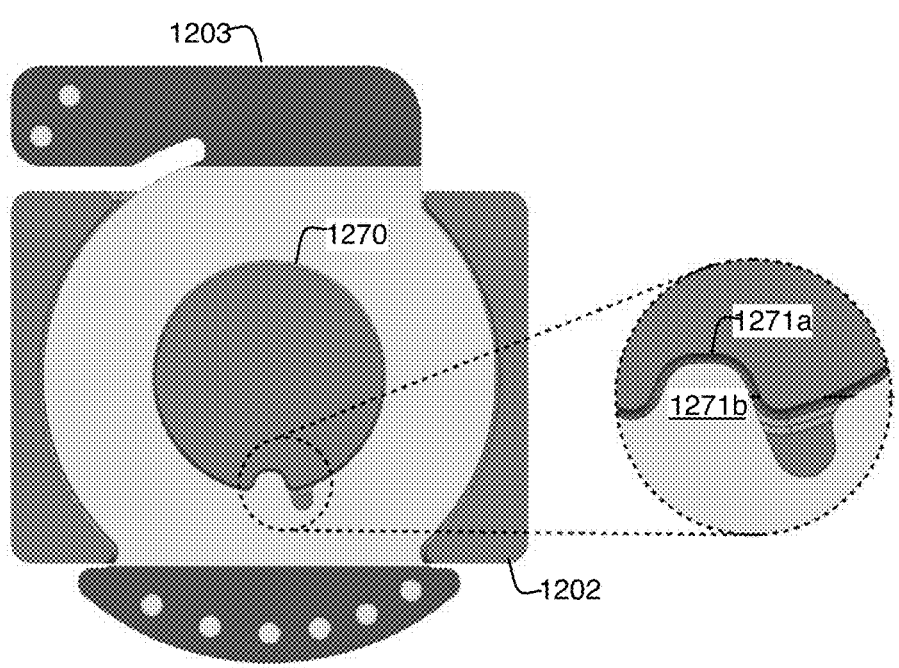
FIG. 12 illustrates a PCB assembly configuration for a planar transformer, including but not limited to a quasi-planar transformer.

FIG. 12 illustrates a PCB assembly configuration for a planar transformer, including but not limited to a quasi-planar transformer. To reduce the size of the PCB 1203, vias connecting different layers of PCB 1203 can be shifted into the center post 1270 of the ferrite core 1202. More specifically, a notch 1271*a* can be formed in the center post, which can accommodate a corresponding small tab 1271*b* on PCB 1203 that extends into notch 1271*a*. The interconnecting vias may be disposed within notch 1271*a*. As a result of this configuration, the overall size of PCB 1203 can be reduced as can the length of the various windings, reducing total resistance and also helping to achieve higher efficiency. Additionally, this construction technique need not be limited to quasi-planar arrangements as described above with respect to FIGS. 5-10, but may also be used in conjunction with conventional planar transformers as described above with respect to FIGS. 2-4.

The foregoing describes exemplary embodiments of quasi-planar transformers and modified configurations for planar transformers. Such configurations may be used in a variety of applications but may be particularly advantageous when used in conjunction with flyback transformers, although both quasi-planar and planar transformers as described herein may find advantageous application to other converter topologies including forward converters, resonant converters, and the like. Although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A quasi-planar transformer comprising:
a first winding comprising one or more turns of wire;
a second winding comprising one or more turns of a conductive trace disposed on a printed circuit board;
a magnetic core positioned with respect to the first and second windings so as to provide a magnetic flux path coupling the first and second windings, wherein the magnetic core comprises an E-core and an I-core secured to the E-core, with the first and second windings disposed within a winding window defined by the E-core and the I-core; and
a notch in a center leg of the E-core, wherein the printed circuit board includes a tab that fits within the notch and wherein one or more vias connecting one or more layers of the printed circuit board are disposed within the tab.

2. The quasi-planar transformer of claim 1 wherein the first winding is primary winding having a first half wound in a clockwise direction on a first side of the printed circuit board and a second half wound in a counterclockwise direction on a second side of the printed circuit board, wherein the first and second halves are formed of a single continuous wire.

3. The quasi-planar transformer of claim 2 wherein the single continuous wire passes through an opening in the printed circuit board.

4. The quasi-planar transformer of claim 3 wherein the first and second halves of the primary winding are secured to the printed circuit board.

5. The quasi-planar transformer of claim 1 wherein the second winding is a secondary winding formed on a first plurality of layers of the printed circuit board, and the first plurality of layers are interconnected by vias through at least the first plurality of layers of the printed circuit board.

6. The quasi-planar transformer of claim 5 further comprising a tertiary winding formed on a second plurality of layers of the printed circuit board and the second plurality of layers are interconnected by vias through at least the second plurality of layers of the printed circuit board.

7. The quasi-planar transformer of claim 1 wherein:
the magnetic core comprises an air gap between a center leg of the E-core and the I-core;
the winding window defined by the E-core and the I-core is taller than a height of an assembly comprising the first and second windings; and
the assembly comprising the first and second windings is disposed within the winding window away from the air gap.

8. The quasi-planar transformer of claim 1 wherein the printed circuit board further comprises a notch located adjacent the tab, the notch dimensioned to define an opening for a continuous wire forming the first winding to pass through the printed circuit board.

9. The quasi-planar transformer of claim 1 wherein one or more inside corners of the E-core defining the winding window are formed to include a curved channel.

10. A quasi-planar transformer comprising:
   a wound primary winding comprising one or more turns of a continuous piece of wire wound in a first direction on a first side of a printed circuit board and one or more turns of the continuous piece of wire wound in a second direction opposite the first direction on a second side of the printed circuit board, wherein the continuous piece of wire passes through the printed circuit board; and
   at least one printed winding comprising one or more turns of a conductive trace on the printed circuit board;
   wherein the wound primary winding and the printed circuit board are disposed within a magnetic core providing a magnetic flux path coupling the wound primary winding and the at least one printed winding, wherein the magnetic core includes an E-core having a center post that passes through the printed circuit board, the at least one printed winding, and the wound primary winding; and
   wherein the E-core defines a slot and the printed circuit board defines a tab disposed within the slot.

11. The quasi-planar transformer of claim 10 wherein a height of the center post of the E-core defines an air gap in the magnetic flux path, and the printed circuit board is disposed within a core window defined by the E-core as far as practicable from the air gap.

12. The quasi-planar transformer of claim 10 wherein the continuous piece of wire passes through the printed circuit board at least partially within the slot.

13. The quasi-planar transformer of claim 10 wherein the continuous piece of wire passes through the printed circuit board adjacent the slot.

14. The quasi-planar transformer of claim 10 wherein:
   the at least one printed winding comprises a secondary winding formed on a first plurality of layers of the printed circuit board;
   the first plurality of layers are interconnected by vias through at least the first plurality of layers of the printed circuit board; and
   the vias through at least the first plurality of layers are located in the tab.

15. The quasi-planar transformer of claim 14 wherein:
   the at least one printed winding further comprises a tertiary winding formed on a second plurality of layers of the printed circuit board;
   the second plurality of layers are interconnected by vias through at least second plurality of layers of the printed circuit board; and
   the vias through at least the second plurality of layers are located in the tab.

16. The quasi-planar transformer of claim 10 wherein one or more inside corners of the E-core are formed to include a curved channel.

* * * * *